United States Patent [19]
De Gelis et al.

[11] Patent Number: 5,225,651
[45] Date of Patent: Jul. 6, 1993

[54] DEVICE FOR LOW-TEMPERATURE PLASMA SURFACE TREATMENT OF A PLATE OR A SHEET OF A METALLIC MATERIAL

[75] Inventors: Pierre De Gelis, Saint Germain En Laye; Joelle Pontet, Gueugnon; Gérard Piet, Bezons; Gérard Pacqueau, Toulon Sur Approux, all of France

[73] Assignee: Ugine S. A., Paris, France

[21] Appl. No.: 762,465

[22] Filed: Sep. 19, 1991

[30] Foreign Application Priority Data

Sep. 19, 1990 [FR] France ......................... 90 11647

[51] Int. Cl.⁵ .............................................. B23K 9/00
[52] U.S. Cl. ............................ 219/121.43; 219/121.42; 156/345; 156/646
[58] Field of Search ........... 219/121.4, 121.43, 121.51, 219/121.52; 156/345, 646, 643; 204/298.21, 298.1

[56] References Cited

U.S. PATENT DOCUMENTS

| | | | |
|---|---|---|---|
| 4,094,722 | 6/1978 | Yamamoto et al. | 156/345 |
| 4,153,527 | 5/1979 | Greenwald, Jr. | 204/164 |
| 4,318,767 | 3/1982 | Hijikata et al. | 156/345 |
| 4,336,438 | 6/1982 | Uehara et al. | 219/121.43 |
| 4,430,547 | 2/1984 | Yoneda et al. | 219/121.43 |
| 4,963,713 | 10/1990 | Horiuchi et al. | 219/121.43 |

*Primary Examiner*—Mark H. Paschall

[57] ABSTRACT

A device for low-temperature plasma surface treatment of a stationary metallic material (8) in plate or sheet form, comprising a sealed enclosure (1) into which a plasma-forming gas is introduced, and a suction device (6) for adjusting the pressure of the gas. The enclosure (1) incorporates a support (7) in contact with the material (8) and at least one fixed or movable electrode (10) having an "active" surface (13) facing the material (8) and defining a space (12) between itself and the surface (9) of the material. The electrode (10) is held at an adjustable distance between its active surface and the surface of the material. A potential difference of given sign and given absolute value is created between the material (8) and the electrode (10), and a low-temperature plasma is generated in the space (12).

11 Claims, 2 Drawing Sheets

DEVICE FOR LOW-TEMPERATURE PLASMA SURFACE TREATMENT OF A PLATE OR A SHEET OF A METALLIC MATERIAL

FIELD OF THE INVENTION

The present invention relates to the surface treatment of a plate or a sheet of a stationary metallic material. Advantageously, it permits in particular the implementation of known processes for improving the corrosion resistance of the material, for improving the adherence of a coating on the surface thereof, or for coloring the surface thereof, these processes being based on exposing the surface of the material to a low-temperature plasma.

PRIOR ART

Processes are known for surface treatment of metallic materials using a so-called "low-temperature" or "cold" plasma, in contrast to thermonuclear fusion plasmas, called "hot" plasmas. The fractional ionization of a low-temperature plasma is modest ($10^{-7}$ to $10^{-3}$). Electrical energy is transferred to the electrons which are fairly few in number, but highly energetic (1 to 10 eV). They thus excite the gas to be heated, the temperature of which may go from 20° to 700° C. approximately, and produce a large number of excited species. One of the methods of producing such a plasma consists in establishing an electroluminescent discharge between two electrodes (cathode and anode) facing one another within a rarefied atmosphere, under a pressure of less than 1000 Pa. Other methods for producing the plasma, such as exciting the rarefied atmosphere by means of microwaves or radio frequencies, are also known and can be applied to the surface treatment of metallic materials.

The Applicant has filed a number of French patent applications relating to processes for surface treatment of metallic materials by means of cold plasmas. Application FR 88 05091 relates to a process for improving the corrosion resistance of a sample. For this purpose, the sample is negatively polarized and exposed to a plasma comprising an oxidizing gas, at least in trace quantities, inside an enclosure in which the pressure is from 1 to 1000 Pa. In an illustrative embodiment, the plasma is generated by establishing a voltage of the order of 100 to 5000 V between an anode and a cathode, the latter consisting of the sample itself, and the treatment time varies from about one second to about ten minutes.

The process described in Application FR 89 13879 aims to improve the adherence to the surface of a sample of a coating which will subsequently be applied to this surface. As in the previous process, the sample to be treated must be negatively polarized.

Finally, the process described in Application FR 89 08085 permits the surface of a sample, such as a stainless steel plate, to be colored. The sample is placed in a rarefied atmosphere comprising an oxidizing plasma. In contrast to the two earlier processes, the sample is positively polarized. Atoms are torn by the plasma from termed the source-electrode (cathode), which is positioned facing the sample. These atoms are oxidized by the plasma, and the oxides thus formed will become deposited on the sample in a layer which endows the surface of the sample with a coloration due to light interference phenomena, the tint of which is a function of the thickness of the layer and therefore depends on the operating conditions and on the duration of the experiment.

Applicant has also filed a Application FR 9007061 relating to a device permitting the above-mentioned processes to be applied to the treatment of moving metal strips of great length.

SUMMARY OF THE INVENTION

It is an object of the present invention to propose a device permitting surface treatment of stationary unit parts, generally of flat shape, according to these same processes.

For this purpose, the subject of the invention is a device for low-temperature plasma surface treatment of a stationary metallic material in plate or sheet form, which comprises a sealed enclosure equipped with means of introducing a gas or a plasma-forming gas mixture, and means for adjusting the pressure permitting it to be maintained at a given value, the enclosure incorporating a support in contact with the material and at least one electrode on which there is arranged a surface, termed the active surface, facing the material and defining a space between itself and the surface of the material, the electrode being equipped with means for holding same and adjusting the distance between the active surface thereof and the surface of the material, means being provided for creating a potential difference of given sign and given absolute value between the material and the electrode, and means being provided for generating a low-temperature plasma present in the space.

In a preferred embodiment, the electrode or electrodes have an active surface with dimensions substantially smaller than those of the material to be treated, and may be displaced during the treatment so as to be able to treat the totality of the surface of the material.

As will be understood, the invention permits a cold plasma surface treatment to be applied to a sheet or to a metallic plate, in particular a steel plate, which is held stationary. In the most elementary version of this device, the electrode facing the plate to be treated is fixed, and has an area at least equal to that of the plate, the entire surface of which is treated simultaneously. In another configuration of the apparatus, the electrode has a relatively small area with respect to that of the part, and is movable, so as to be able to successively treat the whole surface of the plate, or only a portion of the latter. In the case of the application of the device to the coloring of the plate, it is thus possible to color only pertains of the latter, or even, if use is made of an electrode with very small surface area, to carry out the coloring along fine lines, it being possible to form actual drawings as with a pencil.

BRIEF DESCRIPTION OF THE DRAWINGS

The invention will be better understood on reading the following description making reference to the attached plates of drawings, in which.

These figures and the description which follows refer to an apparatus for carrying out coloring treatments on the sheet. However, such apparatuses are easily adapted to other plasma surface treatments alluded to earlier.

DESCRIPTION OF THE PREFERRED EMBODIMENTS

Figure 1:
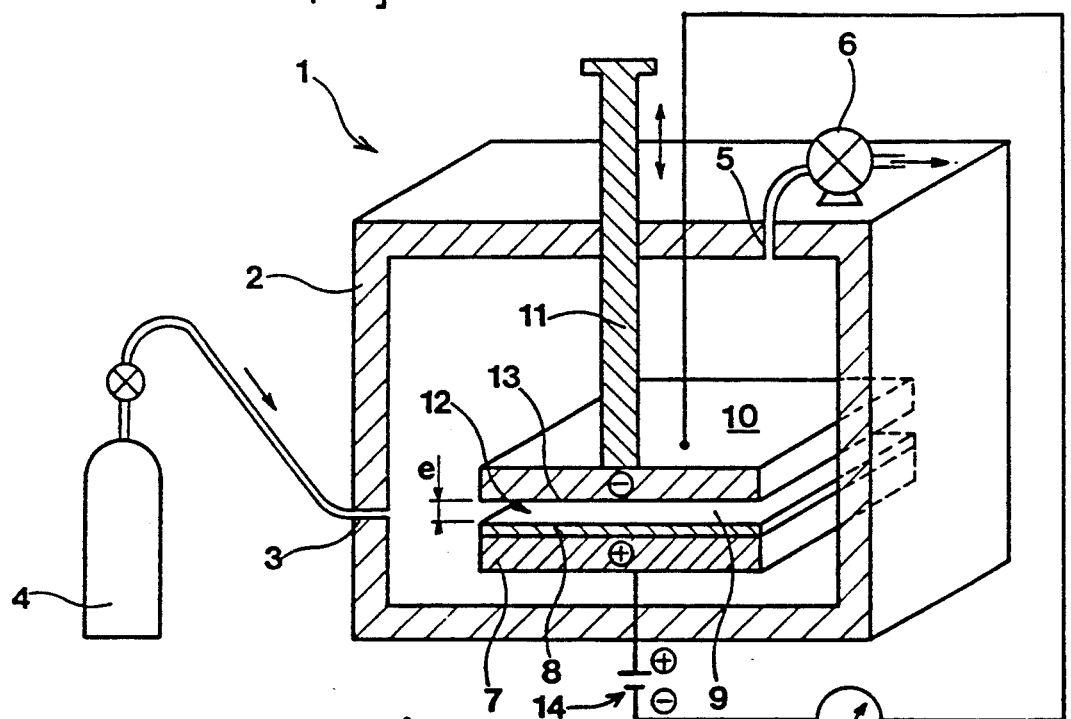
FIG. 1 is a perspective sectional view of an apparatus for coloring a metallic plate according to the invention, in which the source-electrode has an area substantially identical to that of the sheet to be treated.

FIG. 1 shows such an apparatus in its most elementary version. It comprises a sealed enclosure 1, whose wall 2 is promoted with an orifice 3 permitting the gas or the plasma-forming gaseous mixture contained in a container 4 to be introduced into the enclosure. In the case illustrated, this gas or this gaseous mixture contains at least one gas the molecule of which incorporates oxygen atoms, such as oxygen itself, ozone, air, nitrogen oxides and water vapor. Another orifice 5 permits the interior of the enclosure 1 to be connected to a suction device 6 which permits the pressure in the enclosure to be maintained at a known and regulated value. This pressure is to be such that, in conjunction with the other operating parameters of the apparatus, it permits a cold plasma to be produced in the enclosure by means of electroluminescent discharge. In practice, such a pressure is in any case to be less than 1000 Pa.

Inside the enclosure 1 there is a support 7 on which is placed the sheet or the plate 8 to be colored, which is usually made of stainless steel. The support 7 is preferably made of an electrically conducting material. Optionally, it is made of a magnetic material so that the sheet 8, if it too is magnetic, is held against it without a special fixing device being necessary. If the support is too weakly or not magnetic, the magnetic field making it possible to hold the sheet 8 may also be created or intensified by adapted means (not shown), making an electromagnet of the support 7. Without departing from the invention, the holding of the sheet 8 on the support 7 may of course be ensured by any other appropriate means, but a magnetic support offers the advantage of not requiring complicated manipulations or alterations to the sheet 8 and of leaving the surface 9 to be colored completely uncovered, including its edges. The source-electrode 10 which supplies the atoms the oxides of which are to be deposited on the surface 9 of the sheet 8 and give rise to its coloring, is placed opposite the surface 9 to be colored. The source-electrode 10 is equipped with holding means, symbolized by the rod 11, which make it possible to adjust the width "e" of the space 12 defined by the surface 9 to be colored and the active surface 13 of the source-electrode 10 corresponding thereto from outside the enclosure.

In the illustrated embodiment, the surface 9 to be colored and the active surface 13 of the source-electrode 10 which face one another have substantially identical areas, and are disposed in such a way that each point of the sheet 8 faces a point of the source-electrode 10. Moreover, the support 7, assuming that it is made of an electrically conducting material, and the source-electrode 10 are each connected to one of the poles of an electrical supply 14 outside the enclosure. If the support 7 is made of an insulating material, means must then be provided for connecting the sheet directly to the electrical supply 14. For the application of the device to the coloring of the sheet 8, the support 7 is connected to the ⊕ pole of the supply 14, and the assembly which it forms with the sheet 8 acts as an anode. The source-electrode 10 is connected to the ⊖ pole of the supply 14, and acts as a cathode. An adjusting device 15 permits the potential difference between the support 7 and the source-electrode 10 to be regulated. Preferably, the support 7 and the source-electrode 10 are cooled, for example by means (not shown) ensuring circulation of water inside them, so as to hold the sheet 8 and the source-electrode 10 at temperatures which are substantially constant and uniform over the whole of their respective outer surfaces.

The cold plasma which ensures the coloring treatment for the surface 9 of the sheet 8 is created inside the space 12, by electroluminescent discharge.

As disclosed in FR 8908085 already cited, this coloring is obtained by depositing onto the surface 9 of the sheet 8 a thin (a few hundreds of Å) metal oxide layer, the metal atoms of which have been torn from the surface 13 of the source-electrode 10. The nature of these oxides depends on that of the material making up the source-electrode. A ferritic stainless steel electrode makes it possible to form a deposit based on oxides of iron and of chromium. An austenitic stainless steel electrode makes it possible to form a deposit based on oxides of iron, of chromium and of nickel, etc. In order to obtain an especially corrosion-resistant deposit, it is possible to employ a source-electrode made of pure noble metal (titanium, chromium or aluminum, for example) which makes it possible to form a deposit comprising only oxides of such metal. The other operating conditions required for carrying out such a treatment are:

potential difference between the source-electrode 10 and the assembly formed by the support 7 and the sheet 8: 200 to 5000 V approximately;

current density in the sheet 8: 1 to 100 mA/cm$^2$;

time for which a given portion of the sheet 8 faces the source-electrode 10: up to 60 minutes;

distance "l" between the sheet 8 and the source-electrode 10: 1 mm to several centimeters, preferably 1 to 50 mm.

For given experimental conditions, the coloration obtained depends on the treatment time, and it is easy to determine experimentally which color corresponds to which treatment time, i.e., the time for which a portion of the surface t be colored of the sheet 8 faces the source-electrode 10. The thickness of the oxide layer increases if the treatment time increases, if the current density in the sheet 8 increases, if the potential difference between the sheet 8 and the source-electrode 10 increases, and/or if the width "e" of the space 12 decreases. Under these conditions, it is self-evident that, if uniform coloration over the whole surface 9 of the sheet 8 is desired, the latter and the active surface 13 of the source-electrode 10 should be parallel, in other words, the width "e" should be uniform throughout the space 12. A lack of parallelism would lead to obtaining a gradation of coloration, which, of course may be deliberately sought.

In order to avoid forming the plasma starting from the source-electrode assembly 10, which would create spurious phenomena hampering good regularity of operation of the appliance and would cause excessive wear of the latter, the source-electrode 10 can be clad with an insulating material, such as Sirilite ®, leaving uncovered only the active surface 13 which faces the surface 9 of the sheet 8. This cladding not shown in FIG. 1) can be replaced by a guard ring, i.e., a positively polarized electrode whose s matches those of the surfaces of the source-electrode 10 other than the active surface 13, and which is placed a modest distance from these surfaces, of the order of 0.5 mm to a few cm. This distance is so determined, bearing in mind the other experimental conditions, as to make it impossible for a plasma to form between the opposite faces of these two electrodes. It is in any case less than the distance between the active surface 13 of the source-electrode and the surface 9 of the sheet 8.

Moreover, any arrangement aiming to increase the yield of ionization in the plasma can be appended to the apparatus. Such an arrangement can consist, of conventional means for creating a magnetic field between the source-electrode 10 and the sheet 8, such as a permanent magnet or an electromagnet. The effect of the magnetic field is to lengthen the path of the electrons, and the sought-after increase in the ionization yield of the plasma is thus obtained.

If it is desired to color various areas of the sheet 8 non-uniformly, for example in order to create drawings, it is possible to effect several successive treatments of the sheet by masking certain portions of the latter with may be of various shapes, which masks are changed between each treatments. In this way, at the end of the final treatment, the various areas of the sheet will have been exposed to the action of the plasma for different times, depending on the masks which did or did not cover them during the various stages of the treatment. As a different color corresponds to each total time of exposure (for otherwise constant operating parameters for the apparatus), the sought-after colored drawings are obtained on the sheet. The masks may consist of any solid material (paper, adhesive tape, etc.) applied against the sheet, or even an ink deposited on the sheet, for example by means of a pencil or a pad.

The apparatus as just described has drawbacks, principally when it is desired to color sheets of large dimensions (several tens of cm of side). As under these conditions, it is necessary to provide source-electrodes of a size at least equivalent to the size of the sheet, their accurate positioning relative to the sheet may prove tricky. Moreover, in order to obtain through such electrodes the required current density in conjunction with an adequate potential difference, it would be necessary to provide an electrical supply apparatus of relatively sizeable power. By way of example, the treatment of a square sheet of side 1 m, under a voltage of 1200 V between anode and cathode and a current density of 10 mA/cm$^2$, would require a power supply of a minimum of 120 kW. For all these reasons, it may be preferable to decrease the size of the source-electrode while nevertheless retaining the possibility of treating large-area sheets.

Figure 2:
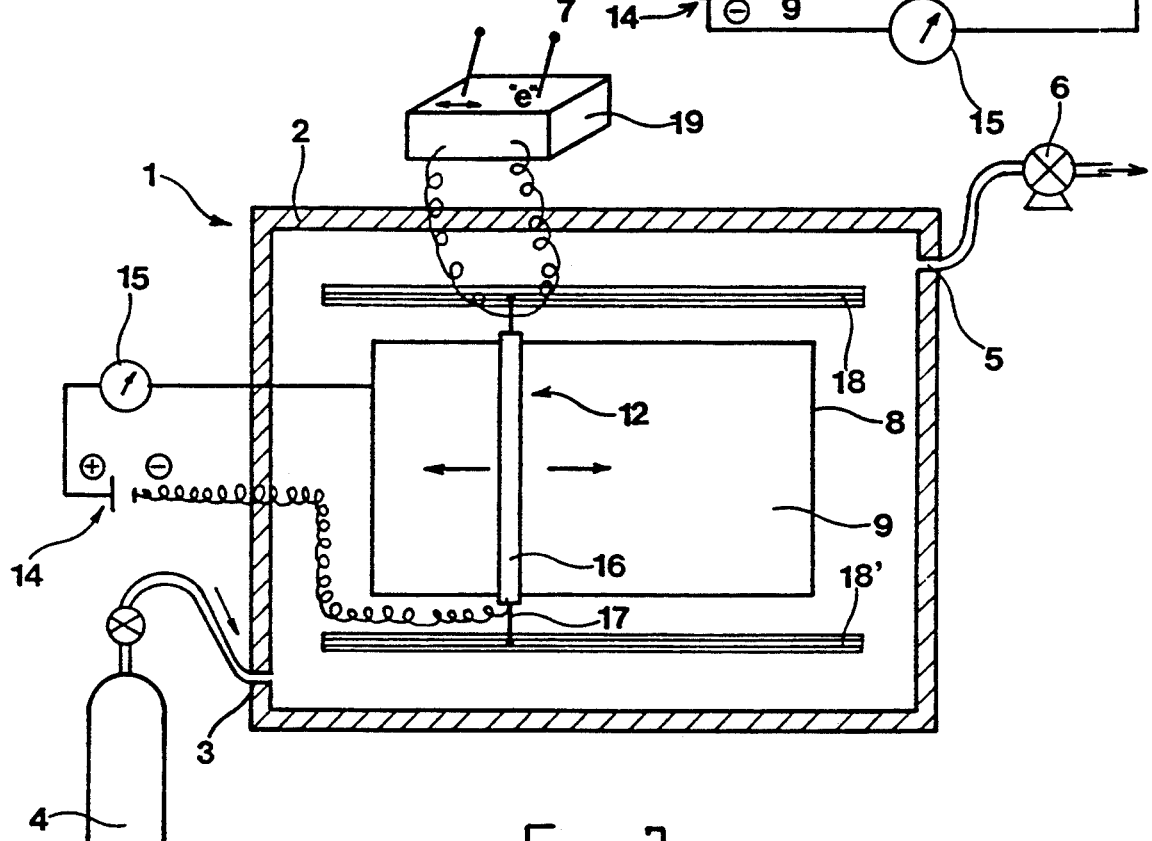
FIG. 2 is a plan view of another apparatus in which the source-electrode is movable along a dimension of the surface of the plate to be treated and has a surface area substantially smaller than that of the sheet.

It is with this objective in mind that the apparatus shown in FIG. 2 has been designed. The sheet to be treated 8, of rectangular shape, is placed as before on a conducting support (not visible here) connected to the ⊕ pole of the electrical supply 14. However, this time, the source-electrode 16 has a surface area markedly less than that of the sheet 8. In the example shown, it takes the form of a part whose face opposite the surface of the sheet 8 is rectangular. Its length is equal to or slightly greater than the dimension of the small side of the sheet 8, and its width is modest relative to the dimension of the large side of the sheet 8. As before, the source-electrode 16 is connected to the ⊖ pole of the electrical supply 14, and is fixed on a support 17, which holds its active surface at a distance "e" from the surface 9 of the sheet 8. Means are provided on this support 17 for displacing it on rails 18,18' disposed parallel to the large sides of the sheet 8 and of its support, in such a way that in the course of this continuous or discontinuous displacement, the active surface of the electrode 16 can be successively placed opposite all the zones to be colored of the surface 9 pf the sheet 8. The displacement of the support 17 is controlled by an actuator 19 outside the enclosure 1, by virtue of which the operator can adjust, manually or via a suitably programmed data processing apparatus, the rate of displacement of the source-electrode 16 and of its support 17 and the distance "e". In conjunction with the electrical parameters, which are fixed by virtue of the supply 14 and the adjusting means 15, these parameters determine the color obtained on the sheet 8 after passage of the source-electrode 16. The source-electrode 16 is furthermore preferably equipped with cooling means (not shown), as is the support for the sheet 8.

With such an apparatus, the power of the electrical supply which is required can be reduced, relative to the case of the source-electrode which covers the whole surface of the sheet, in a ratio identical to the ratio of the respective surface areas of the electrode and of the sheet, all other things being equal. However, the time required to treat the totality of the sheet is increased in the same proportions. Hence, the choice of the width of the source-electrode is the result of a compromise between the advantages of an electrical supply of moderate power and a source-electrode of reduced dimensions, and the requirement of not excessively lengthening the processing time for a sheet, in order to satisfy the demands of productivity of the apparatus.

Figure 3:
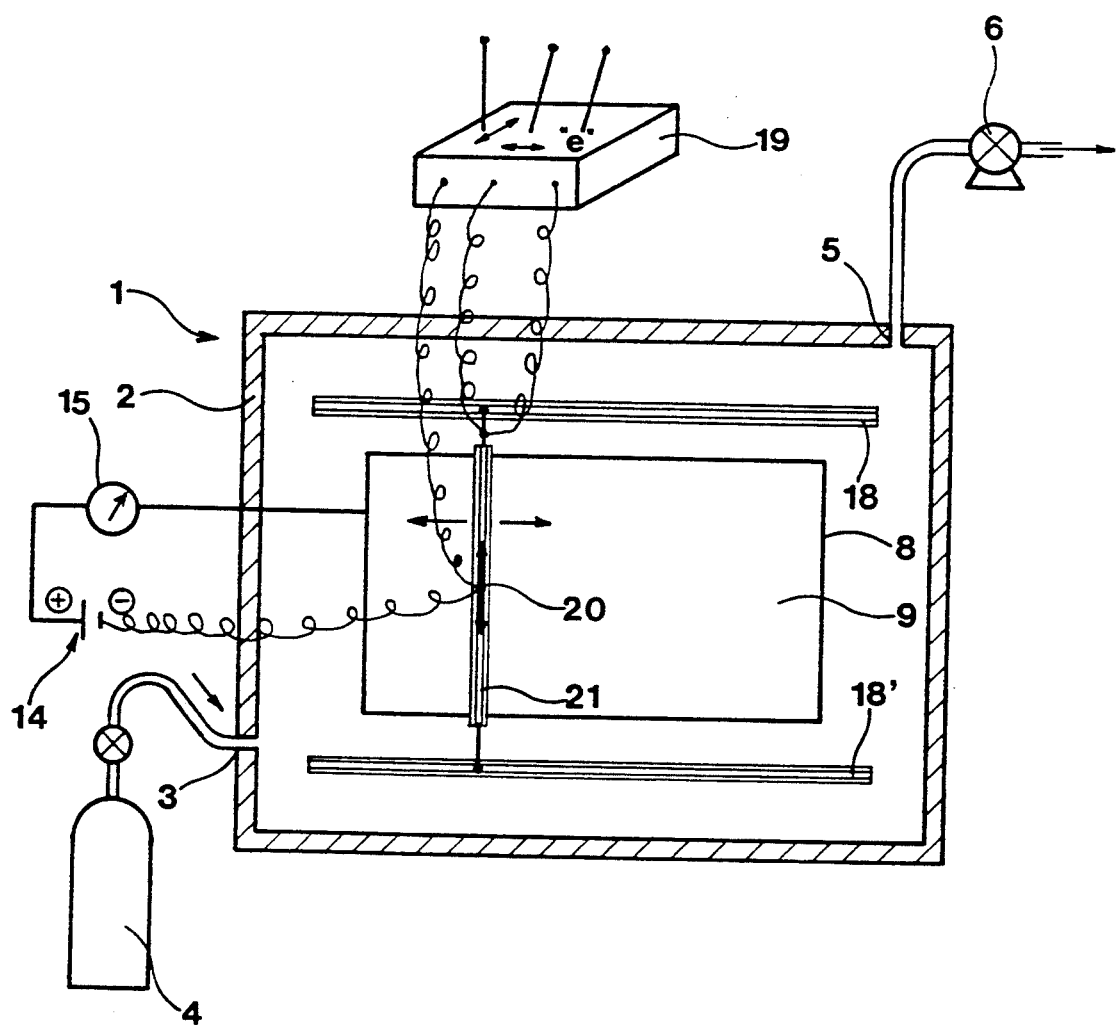
FIG. 3 is a plan view of another embodiment of the apparatus of FIG. 2, in which the source-electrode has a much reduced surface area relative to that of the plate, and is movable along both dimensions of the surface of the sheet.

FIG. 3 shows another embodiment of the apparatus shown in FIG. 2. IT is adapted for making drawings composed of lines of moderate thickness directly on the surface 9 of the sheet 8 without necessarily requiring the use of masks. For this purpose, the source-electrode 20 has an active surface of much reduced dimension relative to the total surface of the sheet 8, so as to be able to effect a pointwise coloring of the surface 9 of the sheet 8. This active surface is, for example, circular or square and its diameter or its side is substantially identical to the thickness of the line or of the point which it is desired to obtain. The source-electrode 20 is mounted on a support 21 which, like the support 17 of the apparatus of FIG. 2, bears on and can move on rails 18,18' parallel to the large sides of the sheet 8. However in this embodiment, the support 21 additionally enables the source-electrode to move over the entire length of the smallest dimension of the sheet 8. Hence, by combining these two movements, it is possible to apply the coloring treatment to a succession of chosen points throughout the surface of the sheet 8. It is thus possible to effect actual drawings in a manner similar to that performed by "plotters" which reconstruct on paper computer-calculated curves. If the adjustment of the distance "e" between the active surface of the source-electrode 20 and the surface 9 of the sheet 8 is added to these two possibility the source-electrode can move in the three spatial dimensions. Means 19 outside the enclosure 1 and connected to the support 21 and to the source-electrode 20 control the displacements thereof. As before, this control can be performed manually or by computer.

It is desirable for the apparatus to permit replacement of the support 21 and the point source-electrode 20 by the support 17 and the source-electrode 16 of larger surface area, so as enable it to be converted it into an apparatus according to FIG. 2. It is thus possible, with the same appliance, to effect a drawing on a sheet, the complete surface of which has previously been or will subsequently be colored. Provision may also be made for the possibility of replacing the point source-electrode 20 by a pencil whose tip, of dimension equal to that of the active surface of the source-electrode 20, can deposit an ink constituting a mask on the surface 9 of the sheet 8. Thus, if it is desired to make, for example, a green drawing on a red background, knowing that the treatment time $t_r$ required to obtain the red coloration is less than the time $t_v$ required to obtain the green coloration, it is possible to proceed by the following steps:

the portions of the sheet corresponding to the drawing are treated with the aid of the point source-electrode 20 in such a way that each relevant point undergoes the treatment for a time $(t_v-t_r)$, the entire surface of the sheet is subsequently treated by means of the source-electrode 16 of larger surface area, in such a way that all the points of the surface undergo the treatment for a time $t_r$.

It results from this that the zones forming the drawing have undergone the treatment for a time $(t_v-t_r)+t_r=t_v$ and are therefore green, whereas the remainder of the sheet has been treated for a time $t_r$, and is therefore red.

If conversely it is desired to obtain a red drawing on a green background:

the drawing which it is desired to see appear is traced on the sheet with the aid of an ink pen used instead of the point electrode 20;

the entire sheet is treated with the aid, of the source-electrode 16 for a time $(t_v-t_r)$;

the ink is removed;

treatment of the entire sheet is resumed for a time $t_r$.

The zones forming the drawing have been treated for a time $t_r$ and are therefore red, and the remainder of the sheet has been treated for a time $t_v$ and is therefore green.

Whether or not the point source-electrode 20 is used, the apparatus according to FIG. 3 therefore seems an especially convenient means of producing fine and complicated line drawings on the sheet 8, especially when the displacements of the support 21 can be computer-controlled.

After experimentally determining, by combining the treatments by means of the point source-electrode 20, by means of the source-electrode 16 of larger surface area and the use of masks, which treatment conditions correspond to the various colors which it is desired to obtain, it is possible to obtain sheets colored according to an infinite variety of colors and patterns.

Of course, modifications may be made to the apparatuses as just described without departing from the concept of the invention. In particular, an apparatus can be envisaged which is equipped not with one, but with several identical or different movable electrodes, making it possible simultaneously to carry out several stages of a complicated coloration treatment, which would permit improvement in the productivity of the apparatus.

The apparatus can also be equipped with a device permitting continuous measurement of the effective distance "e" between the active surface of the source-electrode and the surface of the sheet to be colored. It is thus easier to direct the coloring of plates which, for example, had previously been embossed and would therefore offer a non-uniformly flat surface. The indicator of the measurement of "e" is transmitted to the means of controlling the displacement of the source-electrode which possibly correct the positioning of the source-electrode relative to the sheet and/or its rate of displacement and/or the electrical parameters of the apparatus, so that the sought-after coloration for the relevant zone can be obtained independently of the relief of the sheet in this zone.

The coloring apparatuses just described can easily be adapted for carrying out other cold plasma surface treatments of a metal sheet or plate. For example, to carry out a treatment to improve the corrosion resistance of the surface of the sheet or of a portion thereof, it suffices to reverse the respective polarities of the conducting support for the material, which becomes the cathode, and possibly to modify the electrical parameters of the apparatus.

Finally, for all the apparatuses described, that means of producing the plasma other than electroluminescent discharge between a cathode and an anode, one of which consists of the material to be treated, may be employed. The plasma can thus be produced by excitation of the atmosphere, by microwaves or by radio frequencies. What is essential is that means be provided to hold a potential difference of a regulated sign and regulated absolute volume between the electrode and the metallic material to be treated.

The invention applies to the surface treatment of metal plates and sheets, in particular made of steel, especially to the coloring of stainless steel sheets. It also applies to the treatment of carbon steel sheets coated with a metallic layer.

We claim:

1. A device for low-temperature plasma surface treatment of a stationary metallic material (8), said device comprising a sealed enclosure (1) provided with means (3, 4) of introducing a gas or a plasma-forming gas mixture, and means (6) for adjusting a pressure permitting sad gas or gas mixture to be maintained at a desired pressure, said enclosure (1) incorporating a support (7) in contact with a material (8) and at least one electrode (10, 16, 20) with an "active" surface (13) facing said material (8) and defining a space (12) between said "active" surface and a surface (9) of said material, said electrode (10, 16, 20) being associated with means (11, 17, 19, 21) for holding said electrode and adjusting a distance between said "active" surface of said electrode and said surface of said material, means (14, 15) being provided for creating a potential difference of give sign and given absolute value between said material (8) and said electrode (10, 16, 20), and means being provided for generating a low-temperature plasma present in said space, wherein an area of said "active" surface (13) of said electrode (10, 16, 20) represents only a fraction of an area of said metallic material (8) to be treated and wherein said means (17, 19, 21) for adjusting the distance between said "active" surface of said electrode (16, 20) and said surface of said material (8) enable said electrode (16, 20) to be displaced along at least one dimension of said material (8) while said treatment is being carried out, so as to treat selected portions of said surface of said material (8).

2. The device as claimed in claim 1, wherein said support (7) is provided with means for cooling said material, and wherein said electrode (10, 16, 20) is provided with means for cooling said electrode.

3. The device as claimed in claim 1 or 2, wherein said means (14, 15) for creating a potential difference of given sign and given absolute value between said electrode (10, 16, 20) and said material (8) are adapted for establishing an electroluminescent discharge generating said low-temperature plasma between said electrode (10, 16, 20) and said surface (9) of said material (8).

4. The device as claimed in claim 3, wherein said material (8) is positioned as an anode and said electrode (10, 16, 20) is positioned as a cathode in a circuit for producing said electroluminescent discharge.

5. The device as claimed in claim 3, wherein said material (8) is positioned as a cathode and said electrode (10, 16 20) is positioned as an anode in a circuit for producing said luminescent discharge.

6. The device as claimed in any one of claims 3 to 5, comprising means for creating a magnetic field between said electrode and said conducting support.

7. The device as claimed in claim 1, wherein said electrode (16, 20) is provided with means for continuously measuring the distance between said "active" surface of said electrode and said surface (9) of said material (8) to be treated, and wherein the action of said means (17, 19, 21) for adjusting the position of said electrode (16, 20) and/or the electrical parameter of said device is subservient to said measuring means.

8. The device as claimed in claim 1, wherein said metallic material (8) is in the form of a plate of stainless steel.

9. The device as claimed in claim 1, wherein said metallic material (8) is in the form of a sheet of stainless steel.

10. The device as claimed in claim 1, wherein said metallic material is in the form of a steel plate coated with a metallic layer.

11. The device as claimed in claim 1, wherein said metallic material is in the form of a steel sheet coated with a metallic layer.

* * * * *